United States Patent [19]

Loveall

[11] Patent Number: 5,303,259
[45] Date of Patent: Apr. 12, 1994

[54] FREQUENCY-HOPPED ELECTRONIC SIGNAL TRANSMITTER

[76] Inventor: Peter S. Loveall, 9330 LBJ Freeway, Suite 900, Dallas, Tex. 75243

[21] Appl. No.: 788,821

[22] Filed: Nov. 7, 1991

[51] Int. Cl.$^5$ .......................... H04L 27/30; G08G 1/00
[52] U.S. Cl. .......................................... 375/1; 380/34; 340/902; 340/904; 340/825.36
[58] Field of Search .............. 375/1; 380/34; 340/901, 340/902, 904, 433, 434, 328, 825.36

[56] References Cited

U.S. PATENT DOCUMENTS

| | | | |
|---|---|---|---|
| 1,504,303 | 8/1924 | Affel | 178/2 R |
| 1,596,251 | 8/1926 | Hammond, Jr. et al. | 380/34 |
| 1,612,285 | 12/1926 | Hammond, Jr. | 380/34 X |
| 1,654,920 | 1/1928 | Chaffee | 455/59 |
| 1,732,556 | 10/1929 | Esau | 455/101 |
| 1,766,047 | 6/1930 | Taylor | 455/101 |
| 1,798,415 | 3/1931 | Hahnemann | 455/101 |
| 1,805,918 | 5/1931 | Meissner | 455/101 |
| 1,851,175 | 3/1932 | Hammond, Jr. | 455/61 |
| 1,988,275 | 1/1935 | Harbich | 455/101 |
| 3,348,150 | 10/1967 | Atal et al. | 375/1 X |
| 3,737,776 | 6/1973 | Fletcher et al. | 375/1 X |
| 4,346,448 | 8/1982 | Insam et al. | 364/607 |
| 4,476,566 | 10/1984 | Dent | 375/1 |
| 4,494,238 | 1/1985 | Groth, Jr. | 375/1 |
| 4,727,570 | 2/1988 | Tarbouriech | 379/361 |
| 4,752,902 | 6/1988 | Goldberg | 364/721 |
| 4,975,699 | 12/1990 | Frey | 341/118 |

Primary Examiner—Bernarr E. Gregory
Attorney, Agent, or Firm—Daniel V. Thompson

[57] ABSTRACT

A multi-frequency electronic signal transmitter includes apparatus for transmitting an electronic signal on each of a plurality of transmission frequencies in succession such that the signal is detectable substantially without interruption by a compatible receiver within range of the signal, which is tuned to any one of the transmission frequencies. Direct digital synthesis circuitry is responsive to digital data representing the amplitude of respective discrete portions of a sinusoidal waveform for generating an analog signal corresponding thereto. Frequency control circuitry is provided for controlling the direct digital synthesis circuitry to generate the analog signal on each of the selected frequencies in succession. In one embodiment, the transmission frequencies correspond to selected frequencies in an amplitude modulated (AM) radio broadcast band. In another embodiment, the transmission frequencies correspond to selected frequencies in a frequency modulated (FM) radio broadcast band. A tone generator is provided for generating a modulated signal, such that the transmitted signal is detectable as an audible signal substantially without interruption by a compatible receiver within range of the signal, which is tuned to any one of the selected transmission frequencies.

18 Claims, 4 Drawing Sheets

FREQUENCY-HOPPED ELECTRONIC SIGNAL TRANSMITTER

FIELD OF INVENTION

The present invention relates generally to electronic signal transmitters and in particular to an improved electronic signal transmitter for transmitting an electronic signal on each of a plurality of transmission frequencies in succession such that the signal is detectable by an in-range receiver tuned to any one of the transmission frequencies.

BACKGROUND OF THE INVENTION

Apparatus for transmitting information on multiple frequencies include the so-called "frequency hopping" apparatus in which the transmitter frequency is changed periodically and the receiver is periodically retuned in synchronization with the transmitter. Frequency hopping is often used to overcome deliberately introduced radio interference signals (sometimes known as "jamming") and for secure transmission. A special receiver is required to operate in synchronism with the transmitter. Frequency hopping apparatus is disclosed in U.S. Pat. No. 4,476,566.

Another type of multi-frequency communications apparatus uses the so-called "simulcast" method in which information is transmitted on several different frequencies simultaneously so that a receiver tuned to any of the transmission frequencies can receive the signal. Various types of simulcast apparatus are disclosed in U.S. Pat. Nos. 1,504,303; 1,732,556; 1,766,047; and 1,798,415.

Emergency vehicles, including police cars, fire trucks and ambulances, typically include a siren for emitting an audible signal to warn the drivers of other vehicles in the vicinity of the approaching emergency vehicle. The warning signal may not be heard by drivers sitting in enclosed automobiles, with the airconditioning running and the car radio or stereo in operation. In addition to transmitting an audible warning signal, an emergency vehicle may be equipped with a radio transmitter for generating a warning signal at a selected radio frequency. However, unless an automobile radio is tuned to the particular warning frequency, the driver of the automobile may not be made aware of the approaching emergency vehicle. There is therefore a need for an improved transmitter for generating a warning signal which is detectable by a radio receiver tuned to any frequency within a selected frequency band.

DISCLOSURE OF THE INVENTION

In accordance with the present invention, an improved multi-frequency electronic signal transmitter includes signal generating means for generating a cyclical electronic signal, frequency control means for controlling the signal generating means to generate at least one complete cycle of the electronic signal on each of a plurality of selected transmission frequencies in succession, and transmitter means for transmitting the electronic signal generated by the signal generating means. In accordance with a unique feature of the invention, the transmitted electronic signal is detectable substantially without interruption by compatible electronic signal receiver tuned to any one of the selected transmission frequencies.

In one embodiment, the frequency control means includes first storage means for storing digital data representing the selected transmission frequencies. The signal generating means incudes second storage means having a plurality of discrete storage locations for storing respective discrete digital codes. Each of the digital codes represents an amplitude of a corresponding discrete portion of the electronic signal. The frequency control means further includes clock means for generating a clocking signal at a predetermined clock frequency, first counter means for counting a predetermined number of steps according to a predetermined count sequence and for generating a discrete output signal corresponding to each of the steps, and second counter means responsive to the clocking signal for periodically generating an output signal after a predetermined number of cycles of the clocking signal. The first counter means is responsive to the output signal of the second counter means for generating an output signal indicating the next successive step in the count sequence. The first storage means is responsive to the output signal of the first counter means indicating the next successive step for generating an output signal indicating a next successive frequency in a predetermined sequence of transmission frequencies stored in the first storage means. The clock frequency is at least two times the highest frequency among the selected transmission frequencies.

In another embodiment the signal generating means includes address means responsive to the output signal of the first storage means for addressing selected storage locations of the second storage means to retrieve the respective digital codes stored in the selected storage locations. The signal generating means further includes digital to analog converter means responsive to the respective digital codes retrieved from the second storage means for generating a corresponding analog signal at a frequency corresponding to the output signal of the first storage means.

In the preferred embodiment, the transmitter is a radio frequency transmitter for transmitting a sinusoidal waveform signal on a plurality of selected radio frequencies in succession. The selected radio frequencies preferably correspond to normal radio communication frequencies, including both amplitude modulated (AM) and frequency modulated (FM) radio frequencies. The transmitting means preferably includes both amplitude modulation means for transmitting amplitude modulated radio frequency signals and frequency modulation means for transmitting frequency modulated radio frequency signals. Audio generating means is provided for generating a modulated signal such that the transmitted signal is detected substantially without interruption as an audible signal by a receiver tuned to any one of the transmission frequencies.

The transmitter according to the present invention is adaptable for use in an emergency vehicle, such as a police car, fire truck or ambulance, to emit a warning signal which is detectable substantially without interruption by an automobile radio receiver tuned to any of the transmission frequencies. Because at least one complete cycle of the warning signal is generated on each frequency, the automobile radio receiver will detect the warning signal as a bona fide signal instead of filtering out the signal as unwanted noise. The transmitter according to the present invention uses frequency hopping techniques to transmit an electronic signal at multiple frequencies in succession such that the signal is detectable by a standard receiver tuned to any one of the transmission frequencies. A special receiver which is synchronized to the frequency hopping transmitter is not required.

DETAILED DESCRIPTION OF THE PREFERRED EMBODIMENT

Figure 1:
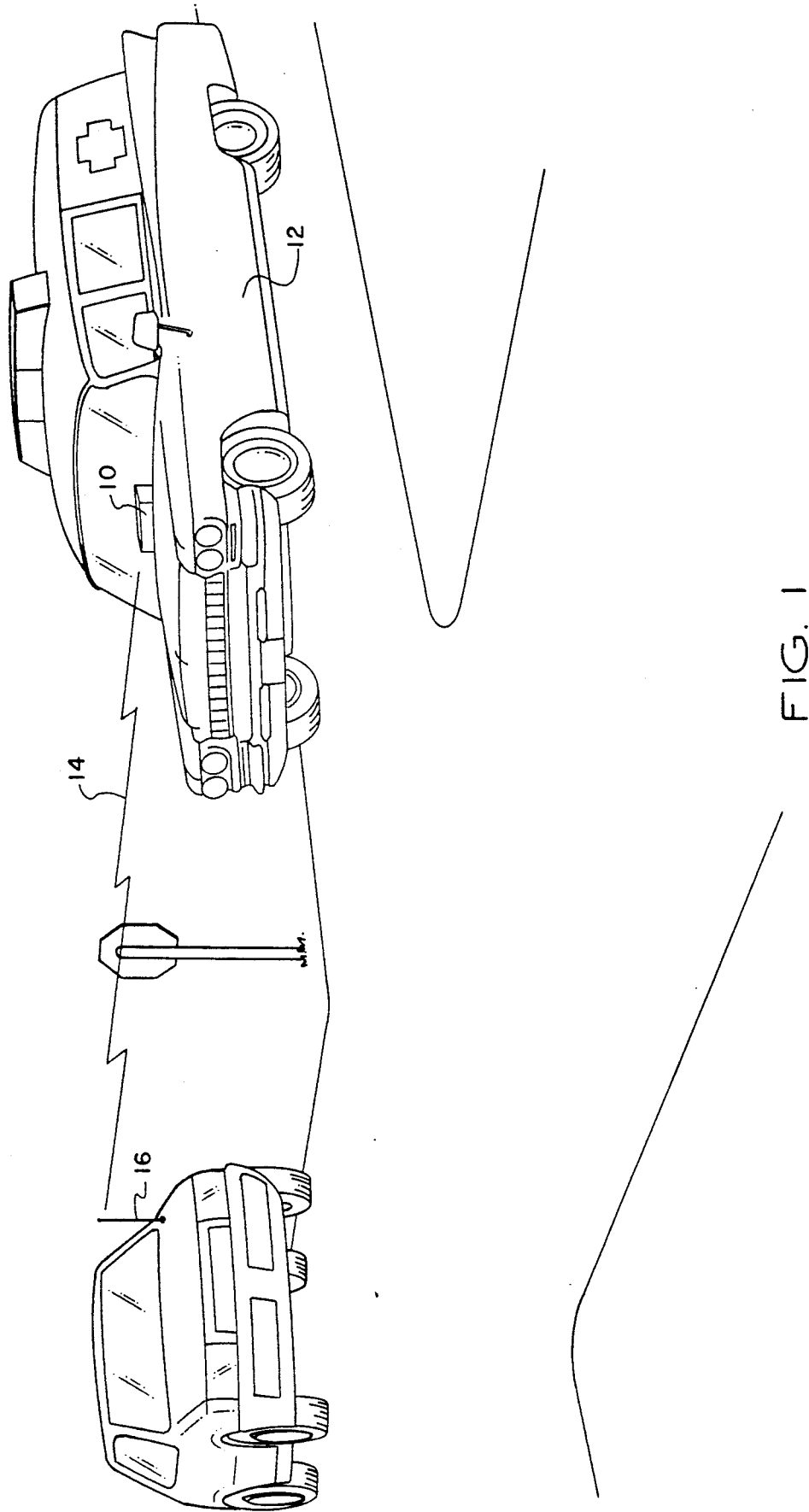
FIG. 1 depicts a transmitter according to the present invention installed in an emergency vehicle for emitting a warning signal which is detectable by automobile car radios within range of the warning signal.

In the description which follows, like parts are marked throughout the specification and drawings with the same respective reference numerals. The drawings are not necessarily to scale and in some instances proportions may have been exaggerated in order to more clearly depict certain features of the invention.

Referring now to FIG. 1, a transmitter 10, according to the present invention, is installed in an emergency vehicle 12, such as police car, fire truck or ambulance. Transmitter 10 is preferably a radio frequency signal transmitter for transmitting a signal 14 on each of a plurality of discrete radio frequencies in succession. Transmitter 10 preferably has the capability of transmitting both amplitude modulated (AM) and frequency modulated (FM) radio signals simultaneously.

Discrete radio frequencies correspond to respective discrete frequencies within a radio broadcast band. Transmitter 10 uses frequency hopping techniques to transmit signal 14 on each of the selected frequencies in succession such that signal 14 is detectable substantially without interruption by a standard automobile radio receiver 16 within range of signal 14, which is tuned to any one of the selected broadcast frequencies. In accordance with a unique feature of the invention, the signals transmitted from the frequency hopping transmitter 10 are detectable by a standard, non-synchronized receiver 16. A special receiver synchronized to the frequency hopping transmitter 10 is not required.

Figure 2:
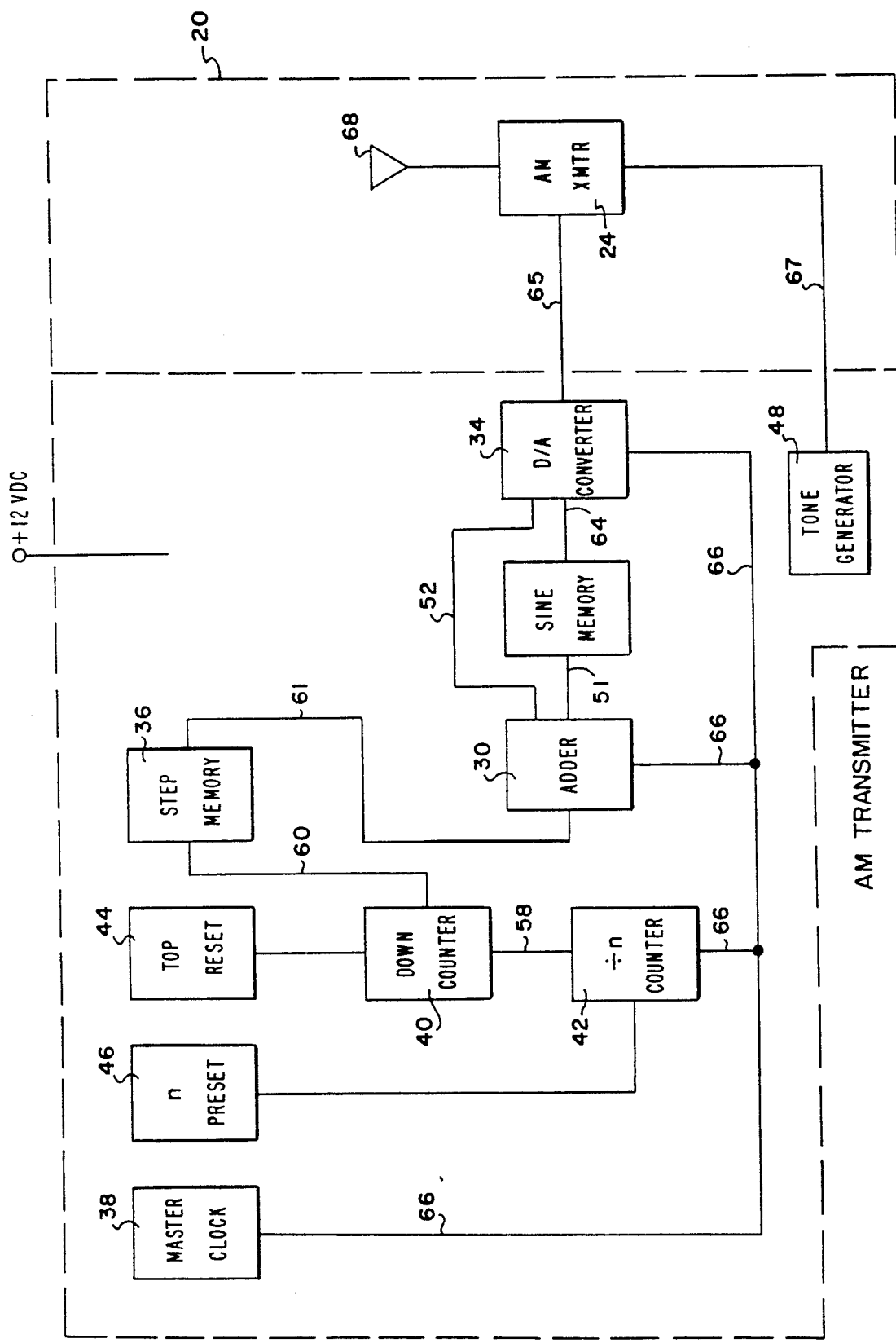
FIG. 2 is a schematic diagram of an amplitude modulated radio signal transmitter, according to the present invention.
Figure 3:
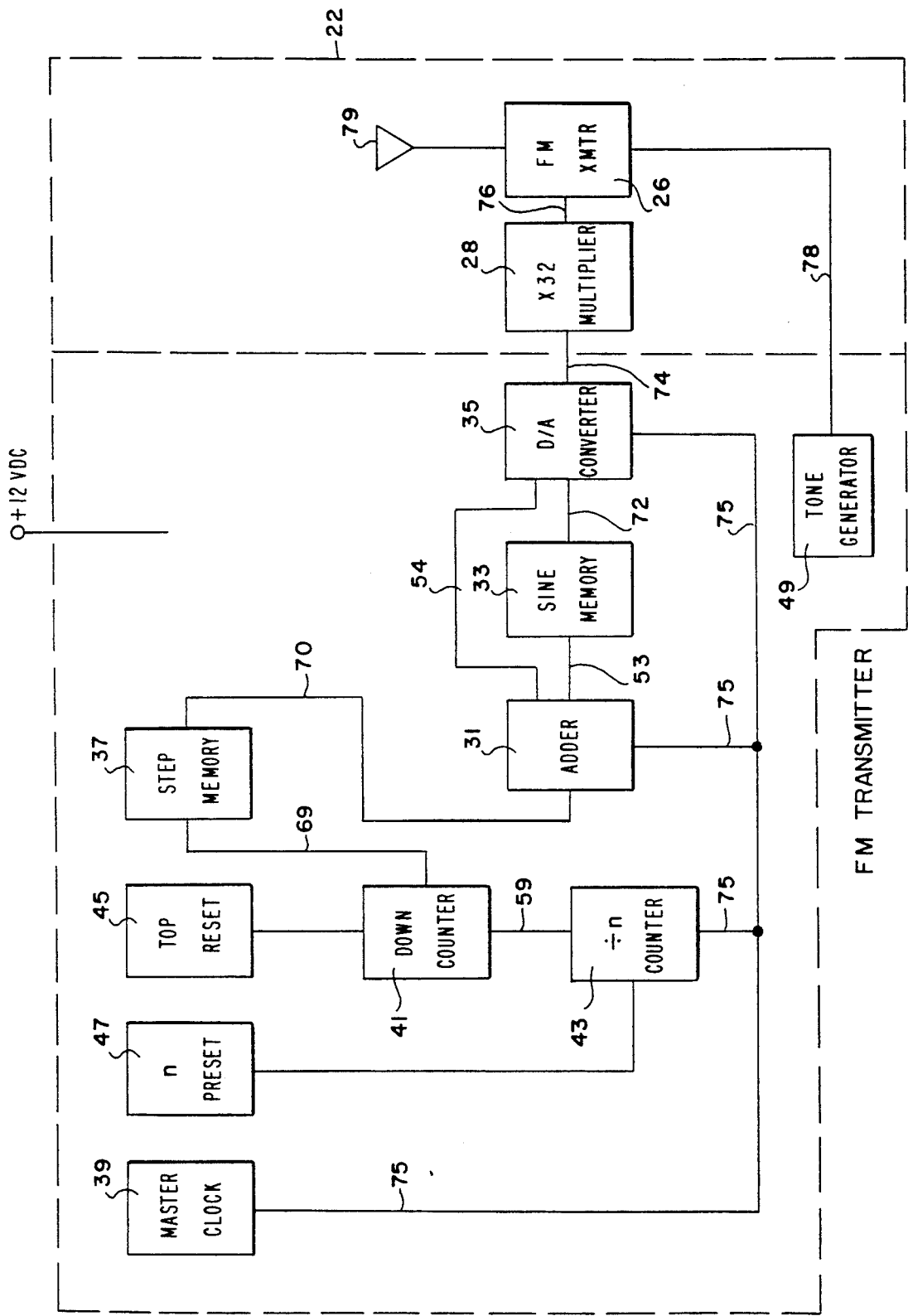
FIG. 3 is a block diagram of a frequency modulated radio signal transmitter, according to the present invention.

Referring also to FIG. 2 and FIG. 3, transmitter 10 includes both an AM section 20 and a FM section 22, which operate independently. AM section 20 includes an AM radio transmitter 24 of the MC1496 type, manufactured and sold by Motorola, Inc. FM section 22 has a FM radio transmitter 26 of the MC2833 type, manufactured and sold by Motorola, Inc., and a frequency multiplier 28, which is comprised of a plurality of discrete transistors defining a five stage doubler circuit, for multiplying the incoming frequency by 32. Otherwise, the hardware components of AM section 20 and FM section 22 are essentially the same.

Both AM section 20 and FM section 22 include direct digital synthesis circuitry for storing a digital coded representation of a sinusoidal waveform and for generating an analog carrier signal corresponding thereto, and frequency control circuitry for controlling the direct digital synthesis circuitry to generate a carrier signal to each of the plurality of radio frequencies in succession. The direct digital synthesis circuitry of AM section 20 includes adder 30, sine memory 32 and digital-to analog (D/A) converter 34. The frequency control circuitry of AM section 20 includes step memory 36, master clock 38, down counter 40, divide-by-n counter 42, top reset 44, n preset 46 and an audio generator, such as tone generator 48. The direct digital synthesis circuitry of FM section 22 includes adder 31, sine memory 33, and D/A converter 35. The frequency control circuitry of FM section 22 includes step memory 37, master clock 39, down counter 41, divide-by-n counter 43, top reset 45, n preset 47 and an audio generator, such as tone generator 49. A 12 volt DC power supply provides electrical power to both AM section 20 and FM section 22.

Each adder 30, 31 is a simple binary accumulator, which is comprised of three, four-bit adder stages. Each adder stage is preferably of the MC74F283N type, manufactured and sold by Motorola, Inc. Each sine memory 32, 33 is preferably an addressable memory of the No. 2716 type, manufactured and sold by National Semiconductor Corporation, among others. Each D/A converter 34, 35 is preferably a digital-to-analog converter of the MC10322 type, manufactured and sold by Motorola, Inc. Each step memory 36, 37 is an addressable memory which maps a binary step number from the corresponding down counter 40, 41 to an actual step increment for the corresponding adder 30, 31. Each step memory 36, 37 is preferably of the MCM10149L10 type, manufactured and sold by Motorola, Inc. Eleven bits of data are required to transmit the step increment information to adder 31 of FM section 22, while only eight bits of data are required to transmit the step increment information to adder 30 of AM section 20. Therefore, two eight-bit memory units are required to perform the function of step memory 37 in FM section 22. Each master clock 38, 39 is preferably of the MC1648 type, manufactured and sold by Motorola, Inc. Each down counter 40, 41 is preferably of the MC74F579 type, manufactured and sold by Motorola, Inc. Each divide-by-n counter 42, 43 is preferably of the MC74F191 type, manufactured and sold by Motorola, Inc. Each tone generator 48, 49 is preferably of the MC14410 type, manufactured and sold by Motorola, Inc.

Each down counter 40, 41 is programmed to count down to "0" in single step increments from a predetermined number representing the corresponding number of discrete transmission frequencies. Each predetermined number is indicated by the corresponding top reset 44, 45. Each top reset 44, 45 includes a row of switches, each of which is selectively set in either an "on" or "off" state. The respective "on" and "off" states of the switches indicate the corresponding predetermined number in binary form.

For example, the normal AM radio broadcast band is from 540 Khz to 1690 Khz with a 10 Khz interval between successive frequencies in the AM band. Therefore, the total number of frequencies in the AM band is 116. Down counter 40 is therefore programmed to count down to "0" from "116" when the selected transmission frequencies of AM portion 20 correspond to the normal AM broadcast band. The normal FM radio broadcast band is from 87.1 Mhz to 107.9 Mhz, with a 200 Khz interval between adjacent frequencies in the FM band. Therefore the total number of frequencies in the FM band is 105. Down counter 41 is programmed to count down to "0" from "105" when the selected transmission frequencies of FM section 22 correspond to the normal FM broadcast band.

Data representing each of the 116 AM frequencies is stored in digital coded form in step memory 36. Data representing each of the 105 FM frequencies is stored in digital coded form in step memory 37. The stored data represents a plurality of discrete integer multiples of a predetermined base frequency. Each of the integer multiples corresponds to a particular one of the discrete transmission frequencies such that successive ones of the transmission frequencies are separated by an interval of frequency corresponding to the base frequency. In AM section 20, the base frequency is set at 10 Khz and the discrete integer multiples stored in step memory 36 range from "54" (540 Khz) to "169" (169 Khz). In FM section 22, the base frequency is set at 100 Khz and the discrete integer multiples stored in step memory 37 range from "871" (87.1 Mhz) to "1079" (107.9 Mhz) in two step increments. The integer multiple stored in step memory 37 are spaced at two step increments because the normal frequency interval in the FM band is 200 Khz. Since the base frequency is set at 100 Khz, the integer multiples are stored in two step increments to provide the required 200 Khz interval between successive frequencies. Each successive integer multiple represents a "step" in the corresponding sequence of broadcast frequencies.

Figure 4:
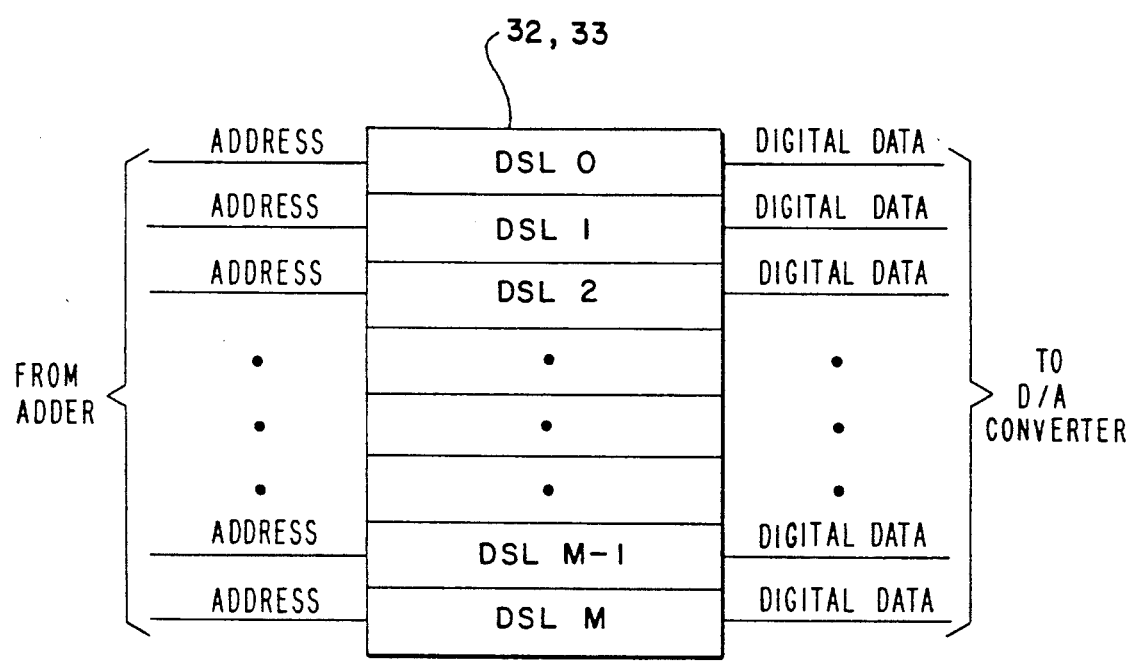
FIG. 4 is a schematic diagram depicting a plurality of discrete storage locations for storing digital coded data representing a signal to be transmitted.

Referring also to FIG. 4, each sine memory 32, 33 has M number of discrete storage locations (DSL's) for storing M number of discrete digital codes representing the amplitude of respective discrete portions of the sinusoidal waveform. The M number of discrete digital codes represents a one-half cycle of the sinusoidal waveform. The number of DSL's depends on the corresponding highest transmission frequency.

For example, in the AM band, the highest frequency is 1690 Khz. Assuming a 10 Khz interval between adjacent frequencies, the "step" corresponding to the highest frequency is "169" (1690 Khz/10 Khz). Therefore, at least 169 DSL's are required for sine memory 32, which is accommodated by a sine memory 32 having 256 DSL's. An eight-bit binary signal is required to address the 256 DSL's. Adder 30 is therefore preferably comprised of three four-bit adders, which are cascaded to provide an eight-bit address signal 51 for addressing sine memory 32 and a one-bit output signal 52, which is fed directly to D/A converter 34.

In the FM band, the highest frequency is 107.9 Mhz. Assuming a 100 Khz base frequency, the "step" corresponding to the highest frequency is "1079". Therefore, at least 1079 DSL's are required for sine memory 33, which is accommodated by a sine memory 33 having 2048 DSL's. An eleven-bit binary address signal 53 is required to address the 2048 DSL's. Adder 31 is therefore preferably comprised of three four-bit adders, which are cascaded to provide the eleven-bit address signal 53 and a one-bit output signal 54, which is fed directly to D/A converter 35.

Each master clock 38, 39 generates a clocking signal at a predetermined frequency. According to the Nyquist sampling theorem, the clock frequency must be at least twice the transmission frequency to ensure the transmission of the complete sinusoidal waveform. The clock frequency must therefore be at least two times the product of the total number (M) of DSL's and the base frequency. In AM section 20, M equals 256 and the base frequency is 10 Khz. Therefore, the clock frequency should be at least 2 ×256 ×10 Khz (i.e., 5.12 Mhz). In FM section 22, M equals 2048 and the base frequency is 100 Khz. However, to accommodate a lower clock frequency, the base frequency is divided by 32, to provide a base frequency of 3125 Hz (100 Khz divided by 32). Therefore, the clock frequency of master clock 39 should be at least 2 ×2048 ×3125 Hz (i.e., 12.8 Mhz).

Each divide-by-n counter 42, 43 is programmed to count down to "0" from a predetermined number (n) of clock cycles and to generate a corresponding output signal when the count reaches "0", to decrement down counter 40, 41 by one step. For example, divide-by-n counter 42 of AM section 20 is programmed by n preset 46 to count ten clock cycles before generating an output signal 58. Divide-by-n counter 43 of FM section 22 is programmed to count five clock cycles before generating an output signal 59. The predetermined number of clock cycles corresponds to the number of clock cycles required to generate at least one complete cycle of the sinusoidal waveform on each of the selected frequencies. Each divide-by-n counter 42, 43 ensures that sufficient clock cycles occur between frequency changes to create a complete sine wave. One skilled in the art will recognize that the higher the frequency, the fewer the number of clock cycles required to generate a complete cycle of the sine wave.

Each down counter 40, 41 generates an eight-bit binary output signal representing the particular step being counted by the corresponding down counter 40, 41. The corresponding step memory 36, 37 maps the binary output signal from the corresponding down counter 40, 41 to a corresponding integer multiple. For example, at the beginning of the count cycle, down counter 40 of AM section 20 generates an output signal 60 indicating step "116". Step memory 36 is responsive to output signal 60 for generating an eight-bit output signal 61 indicating integer multiple "54", which corresponds to 540 Khz, the first frequency in the AM sequence. Adder 30 is responsive to output signal 61 for generating the eight-bit address signal 51, which is fed to sine memory 32 and the one-bit address signal 52, which is fed directly to D/A converter 34. Address signal 51 indicates the particular DSL's addressed in sine memory 32. When output signal 61 indicates step "54", selected ones of the DSL's are addressed at 54 step intervals. Therefore, the particular DSL's which are addressed correspond to steps 0, 54, 108, 162 and 216 on the positive one-half cycle of the sinusoidal waveform. Digital coded data stored in each of the addressed DSL's is transmitted as an eight-bit output signal 64 to D/A converter 34. The seven least significant bits of output signal 64 represent the amplitude of a discrete portion of a sinusoidal waveform. The one-bit signal 52 represents the most significant bit and indicates whether the corresponding amplitude data is on the positive or the negative half-cycle of the sinusoidal waveform. To generate at least one complete cycle of the sinusoidal waveform, five additional DSL's are addressed, corresponding to the negative one-half cycle of the sinusoidal waveform, so that a total of ten DSL's are addressed for each transmission frequency. After the DSL's corresponding to steps 0, 54, 108, 162 and 216 are addressed to define the positive one-half cycle of the sinusoidal waveform, adder 30 will continue to address sine memory 32 at 54 step intervals after step 216, which correspond to steps 14, 68, 122, 176 and 230, to define the negative one-half cycle of the sinusoidal waveform at 540 Khz. D/A converter 34 is responsive to output signals 52 and 64 for generating an analog carrier signal 65 at the selected transmission frequency.

Master clock 38 generates a clocking signal 66, which controls the speed at which adder 30 addresses sine memory 32. The selected DSL's are addressed sequentially, with one DSL being addressed during each clock cycle. When divide-by-n counter 42 counts ten clock cycles, it generates output signal 58 to decrement the down counter 40 to the next step (i.e., to step "115"). Step memory 36 is responsive to the decremented output signal 60 from down counter 40 for incrementing output signal 61 by one integer multiple (i.e., from step "54" to step "55"). Step "55" is the next step in sequence after step "54" and corresponds to a transmission frequency of 550 Khz (i.e., 55 multiplied by the 10 Khz base frequency). Adder 30 is responsive to the incremented output signal 61 indicating step "55" for addressing selected ones of the DSL's at 55 step intervals (i.e., at the locations corresponding to steps 0, 55, 110, 165 and 220 to define the positive one-half cycle of the sinusoidal waveform and steps 19, 74, 129, 184 and 239 to define the negative one-half cycle of the sinusoidal waveform). The amplitude data stored in each of the addressed locations is transmitted to D/A converter 34 via output signal 64, with output signal 52 indicating whether the amplitude data corresponds to the positive or the negative half-cycle of the waveform. D/A converter 34 is responsive to output signals 52 and 64 for generating analog carrier signal 65 at a frequency of 550 Khz. When divide-by-n counter 42 counts ten clock cycles corresponding to step "55", it generates output signal 58 to decrement down counter 40 to the next step (i.e., to step "114"). The aforementioned procedure is repeated in succession for all 116 frequencies. When down counter 40 counts down to "0", it is automatically reset to the step value indicated by top reset 44 (i.e, step "116"). Down counter 40 then automatically begins the count cycle anew, starting again at step "116".

Tone generator 48 feeds a modulated audio signal 67 into AM transmitter 24. The output of D/A converter 34 is a sinusoidal carrier signal 65, which is amplitude modulated in AM transmitter 24 to generate an amplitude modulated radio frequency signal 68. At a clock frequency of 5.12 Mhz, each frequency in the AM broadcast band is transmitted more than 4,000 times per second such that radio signal 68 is detectable as an audible signal substantially without interruption by a standard AM radio receiver within range of signal 68, which is tuned to any one of the AM transmission frequencies.

As previously mentioned divide-by-n counter 43 of FM section 22 is programmed to count five clock cycles before generating output signal 59. At the beginning of the count cycle, down counter 41 generates an eight-bit binary output signal 69 indicating step "105". Step memory 37 is responsive to output signal 69 for generating an eleven-bit binary output signal 70 indicating integer multiple "871", which corresponds to 87.1 Mhz, the first frequency in the FM sequence. In order to accommodate lower clock frequencies, the 100 Khz base frequency is divided by 32 to provide a frequency interval of 3125 Hz between adjacent steps.

Adder 31 is responsive to output signal 70 for generating the eleven-bit address signal 53, which is fed to sine memory 33. The eleven-bit address signal 53 indicates the particular DSL's addressed in sine memory 33. When output signal 71 indicates step "871", address signal 71 addresses selected ones of the DSL's at 871 step intervals. Therefore, the particular DSL's which are addressed correspond to steps 0, 871, 1742 on the positive half-cycle of the sine wave and the steps 565 and 1336 on the negative half-cycle of the sine wave. The digital coded data stored in each of the selected DSL's is transmitted as an eight-bit output signal 72 to D/A converter 35. Output signal 72 represents the seven least significant bits of the corresponding digital coded data and indicates the amplitude of a corresponding discrete portion of the sine wave. The eighth bit, representing the most significant bit of the data, is fed directly from adder 31 to D/A converter 35 via output signal 54. Output signal 54 indicates whether the particular output signal 72 corresponds to the positive or negative half-cycle of the sine wave. D/A converter 35 is responsive to the digital data for generating an analog carrier signal 74 at a frequency corresponding to the selected transmission frequency, divided by 32.

Master clock 39 generates a clocking signal 75, which controls the speed at which adder 31 address sine memory 33. The selected DSL's are addressed sequentially, with one DSL being addressed during each clock cycle. When divide-by-n counter 43 counts five clock cycles, it generates output signal 59 to decrement down counter 41 to the next step (i.e., step "104"). Step memory 37 is responsive to the decremented output signal 69 from down counter 41 for incrementing output signal 70 by two integer multiples (i.e., from step "871" to step "873"). Step "873" is the next step in sequence after step "871" and corresponds to a transmission frequency of 87.3 Mhz. Adder 31 is responsive to the incremented output signal 70 indicating step "873" for addressing selected DSL's at 873 step intervals (i.e., at locations corresponding to steps 0, 873, 1746, 571 and 1444). D/A converter 35 is responsive to output signals 54 and 72 for generating analog carrier signal 74 at a frequency of 873 Mhz, divided by 32. Divide-by-n counter 43 counts five clock cycles corresponding to step "873" and again generates output signal 59 to decrement down counter 41 to the next step (i.e., step "103"). The aforementioned procedure is repeated in succession for all 105 frequencies. When down counter 41 counts down to "0", it is automatically reset to the step value indicated by top reset 45 (i.e., step "105"). Down counter 41 then automatically begins the count cycle anew, starting again at step "105".

The analog carrier signal 74 from D/A converter 35 is frequency multiplied by 32 in frequency multiplier 28 to generate a carrier frequency signal 76 at the desired transmission frequency. Frequency multiplier 28 is preferably comprised of a five stage doubler circuit for doubling the frequency in each of the five stages so that the frequency of output signal 76 from frequency multiplier 28 is 32 times the frequency of input signal 74.

Tone generator 49 feeds an audio signal 78 into FM transmitter 26. Output signal 76 from frequency multiplier 28 is a sinusoidal carrier signal, which is frequency modulated in FM transmitter 26 to generate a frequency modulated radio frequency signal 79. At a clock frequency of 12.8 Mhz, each frequency in the FM broadcast band is transmitted more than 4,000 times per second, which permits a standard voice signal to be used. Radio signal 79 is detectable as an audible signal substantially without interruption by a standard FM radio receiver within rang of radio signal 79, which is tuned to any one of the FM transmission frequencies.

AM section 20 and FM section 22 of transmitter 10 are adapted for simultaneous and independent operation such that transmitter 10 has the capability of transmitting both AM and FM radio signals at the same time.

The transmitter according to the present invention is particularly well-suited for use in an emergency vehicle, such as a police car, fire truck or ambulance, to emit a warning signal which is detectable as an audible tone substantially without interruption by an automobile radio receiver within range of the signal, which is tuned to any one of the transmission frequencies. Because at least one complete cycle of the warning signal is generated on each frequency, the automobile radio receiver will detect the warning signal as a bona fide signal instead of filtering out the signal as unwanted noise. In accordance with the present invention, frequency hopping techniques are used to transmit an electronic signal at multiple radio frequencies in succession such that the signal is detectable by a standard radio receiver within range of the signal, which is tuned to any one of the transmission frequencies. A special receiver which is synchronized to the frequency hopping transmitter is not required.

Various embodiments of the invention have now been described in detail. Since it is obvious that many changes in and additions to the above-described preferred embodiment may be made without departing from the nature, spirit and scope of the invention, the invention is not to be limited to said details, except as set forth in the appended claims.

What is claimed is:

1. A frequency-hopped electronic transmitter, comprising, in combination:
    signal generating means for generating a cyclical electronic signal;
    frequency-hopping control means for control-ling said signal generating means to generate at least one complete cycle of said electronic signal on each of a plurality of selected transmission frequencies in succession;
    modulation means for modulating the electronic signal; and
    transmitter means for transmitting the electronic signal generated by said signal generating means, the transmitted electronic signal being detectable by a compatible electronic signal receiver tuned to any one of the selected transmission frequencies.

2. The transmitter of claim 1 further including audio generator means for generating a modulated audio signal, said electronic signal being detectable as an audible signal by said compatible electronic signal receiver tuned to any of the selected transmission frequencies.

3. The transmitter of claim 1 wherein the electronic signal generated by said signal generating means is a radio frequency carrier signal, said transmitting means including amplitude modulation means for amplitude modulating said carrier signal.

4. The transmitter of claim 1 wherein the electronic signal generated by said signal generating means is a radio frequency carrier signal, said transmitting means including frequency modulation means for frequency modulating said carrier signal, said transmitter further including frequency multiplier means for multiplying the frequency of said carrier signal before said carrier signal is frequency modulated.

5. The transmitter of claim 1 wherein said frequency control means includes first storage means for storing digital data representing the selected transmission frequencies, said signal generating means including second storage means having a plurality of discrete storage locations for storing respective discrete digital codes, each of said digital codes representing an amplitude of a corresponding discrete portion of the electronic signal.

6. The transmitter of claim 5 wherein said selected transmission frequencies correspond to respective selected frequencies in an amplitude modulated radio broadcast band.

7. The transmitter of claim 5 wherein said selected transmission frequencies correspond to respective selected frequencies in a frequency modulated radio broadcast band.

8. The transmitter of claim 5 wherein said frequency control means further includes:
    clock means for generating a clocking signal at a predetermined clock frequency, said clock frequency being at least two times the highest frequency among the selected transmission frequencies;
    first counter means for counting a predetermined number of steps in a step memory according to a predetermined count sequence and for generating a discrete output signal corresponding to each of the steps, said number of steps corresponding to the total number of said selected transmission frequencies; and
    second counter means responsive to said clocking signal for periodically generating an output signal after a predetermined number of cycles of said clocking signal, said first counter means being responsive to said output signal of said second counter means for generating an output signal indicating a next successive step in the count sequence, said first storage means being responsive to the output signal of said first counter means indicating said next successive step for generating an output signal indicating a next successive frequency in a predetermined sequence of transmission frequencies stored in said first storage means.

9. The transmitter of claim 8 wherein said first counter means is automatically reset to repeat the count cycle at the end of each count cycle.

10. The transmitter of claim 8 wherein said signal generating means includes address means responsive to said output signal of said first storage means for addressing selected storage locations of said second storage means to retrieve the respective digital codes stored in said selected storage locations, said signal generating means further including digital to analog converter means responsive to the respective digital codes retrieve from said second storage means for generating a corresponding analog signal at a frequency corresponding to the output signal of said first storage means.

11. The transmitter of claim 10 wherein said output signal of said first storage means indicates a discrete integer multiple of a predetermined base frequency such that each of the selected transmission frequencies is represented by a corresponding integer multiple, each of the selected storage locations addressed by said address means being separated from a next successive one of said selected storage locations by a number of intermediate storage locations corresponding to the integer multiple indicated by said output signal of said first storage means.

12. The transmitter of claim 11 wherein said address means generates an address signal for addressing said selected storage locations, said address means including adder means for incrementing the address signal by an amount corresponding to the integer multiple indicated by the output signal of said first storage means after each cycle of the clocking signal.

13. The transmitter of claim 8 wherein said analog signal is a sinusoidal waveform, each of said discrete digital codes representing an amplitude of a corresponding discrete portion of said waveform, at least one complete cycle of said waveform being generated by said signal generating means at each of the transmission frequencies.

14. A frequency-hopped radio transmitter, comprising, in combination:
   first storage means for storing data representing selected radio frequencies;
   second storage means for storing data representing at least one complete cycle of a sinusoidal carrier signal;
   signal generating means responsive to the data stored in said second storage means for generating said carrier signal; and
   frequency-hopping control means for controlling said signal generating means to generate said at least one complete cycle of said carrier signal on each of the selected radio frequencies in succession;
   modulation means for modulating said carrier signal; and
   transmitting means for sequentially transmitting said modulated signal on each of the selected radio frequencies in succession, the transmitted signal being detectable by a compatible radio receiver tuned to any of the selected radio frequencies.

15. The transmitter of claim 14 further including audio generator means for generating a modulated audio signal, said modulated signal being detectable as an audible signal by said compatible radio receiver tuned to any of the selected radio frequencies.

16. The transmitter of claim 15 wherein said modulation means includes amplitude modulation means for amplitude modulating said carrier signal.

17. The transmitter of claim 15 wherein said modulation means includes frequency modulation means for frequency modulating said carrier signal, said transmitter further including frequency multiplier means for multiplying the frequency of said carrier signal before said carrier signal is frequency modulated.

18. A frequency-hopped electronic signal transmitter, comprising, in combination:
   first storage means for storing digital data representing selected transmission frequencies;
   second storage means for storing a plurality of discrete digital codes representing respective amplitudes of respective portions of a sinusoidal waveform;
   signal generating means responsive to the digital codes stored in said second storage means for generating an analog signal corresponding to said sinusoidal waveform;
   frequency control means for controlling said signal generating means to generate at least one complete cycle of said analog signal a each of the selected transmission frequencies in succession; and
   transmitting means for transmitting said analog signal on each of said transmission frequencies in succession, said analog signal being detectable by a compatible electronic signal receiver tuned to any of the selected transmission frequencies.

* * * * *